(12) United States Patent
Seki

(10) Patent No.: US 10,648,748 B2
(45) Date of Patent: May 12, 2020

(54) COOLER

(71) Applicant: NIKKEI HEAT EXCHANGER COMPANY, LTD., Shizuoka (JP)

(72) Inventor: Kazuhito Seki, Shizuoka (JP)

(73) Assignee: NIKKEI HEAT EXCHANGER COMPANY, LTD., Shizuoka (JP)

( * ) Notice: Subject to any disclaimer, the term of this patent is extended or adjusted under 35 U.S.C. 154(b) by 168 days.

(21) Appl. No.: 15/749,359

(22) PCT Filed: Aug. 3, 2016

(86) PCT No.: PCT/JP2016/003578
§ 371 (c)(1),
(2) Date: Jan. 31, 2018

(87) PCT Pub. No.: WO2017/022244
PCT Pub. Date: Feb. 9, 2017

(65) Prior Publication Data
US 2018/0238642 A1 Aug. 23, 2018

(30) Foreign Application Priority Data

Aug. 5, 2015 (JP) .................................. 2015-154707

(51) Int. Cl.
*F28F 9/02* (2006.01)
*H01M 10/625* (2014.01)
(Continued)

(52) U.S. Cl.
CPC .............. *F28F 9/0251* (2013.01); *F28F 9/18* (2013.01); *H01L 23/427* (2013.01);
(Continued)

(58) Field of Classification Search
CPC . H05K 7/20254; H01L 23/473; H01L 23/427; H01L 23/42; F28F 9/0251;
(Continued)

(56) References Cited

U.S. PATENT DOCUMENTS 2,981,520 A * 4/1961 Chadburn ............... F28F 1/045
165/170
3,264,756 A * 8/1966 Fuentevilla ............ F26B 5/06
34/237
(Continued)

FOREIGN PATENT DOCUMENTS

DE 102013011692 1/2015
JP 61173470 A2 8/1986
(Continued)

OTHER PUBLICATIONS

International Search Report dated Oct. 25, 2016 filed in PCT/JP2016/003578.
(Continued)

*Primary Examiner* — Tho V Duong
*Assistant Examiner* — Raheena R Malik
(74) *Attorney, Agent, or Firm* — Rankin, Hill & Clark LLP

(57) ABSTRACT

Provide is a cooler in which the number of components can be decreased and the space can be reduced. The cooler includes: a cooling plate (10) having a flat shape and including a plurality of refrigerant passages (14) partitioned by a plurality of partition walls (13, 13A) parallel to each other along a longitudinal direction; a first cutout portion (11), which is formed at one end of the cooling plate in the longitudinal direction, and is opened on an upper side and at an end portion in the longitudinal direction while leaving both side walls (10c, 10d) in a width direction and one (13A) of the plurality of partition walls; a second cutout portion (12), which is formed at another end of the cooling plate in the longitudinal direction, and is opened on the upper side and at an end portion in the longitudinal direction while leaving both the side walls in the width direction; a first upper lid member (20), which is joined to the first cutout portion, and has a refrigerant inlet port (25) and a refrigerant
(Continued)

outlet port (27) respectively communicating to a refrigerant inlet side and a refrigerant outlet side partitioned by the one of the plurality of partition walls; and a second upper lid member (30), which is joined to the second cutout portion, and forms, between the second upper lid member and the second cutout portion, a flow passage space (35) causing the refrigerant inlet side and the refrigerant outlet side to communicate to each other.

4 Claims, 16 Drawing Sheets

(51) Int. Cl.
| | |
|---|---|
| *H01M 10/6556* | (2014.01) |
| *H01M 10/613* | (2014.01) |
| *H05K 7/20* | (2006.01) |
| *H01L 23/473* | (2006.01) |
| *H01M 10/6569* | (2014.01) |
| *F28F 9/18* | (2006.01) |
| *H01L 23/427* | (2006.01) |

(52) U.S. Cl.
CPC ........ *H01L 23/473* (2013.01); *H01M 10/613* (2015.04); *H01M 10/625* (2015.04); *H01M 10/6556* (2015.04); *H01M 10/6569* (2015.04); *H05K 7/20* (2013.01); *H05K 7/20936* (2013.01); *F28F 2275/04* (2013.01); *H01M 2220/20* (2013.01)

(58) Field of Classification Search
CPC ........ F28F 9/18; F28F 2275/04; F28F 9/0253; F28F 9/0256; F28F 9/0258; F28F 9/001; F28F 3/00; F28F 3/02; H01M 10/613; H01M 10/625; H01M 10/6556; H01M 10/6569; H01M 10/60
USPC ................. 165/80.4, 168, 170, 176; 361/699
See application file for complete search history.

(56) References Cited

U.S. PATENT DOCUMENTS

| | | | | | |
|---|---|---|---|---|---|
| 4,578,324 | A | | 3/1986 | Van Ommering | |
| 5,170,319 | A | * | 12/1992 | Chao-Fan Chu | ... H01L 23/4338 |
| | | | | | 165/170 |
| 6,563,709 | B2 | * | 5/2003 | Negishi | ................... F28F 3/025 |
| | | | | | 165/80.4 |
| 6,613,472 | B1 | | 9/2003 | Watanabe | |
| 8,441,794 | B2 | * | 5/2013 | Hou | ........................ F28F 3/048 |
| | | | | | 361/699 |
| 9,593,891 | B2 | * | 3/2017 | Moser | ........................ F28F 9/00 |
| 2005/0199372 | A1 | * | 9/2005 | Frazer | ........................ F28F 3/12 |
| | | | | | 165/80.4 |
| 2010/0044015 | A1 | * | 2/2010 | Capriz | .................. H01L 23/473 |
| | | | | | 165/104.33 |
| 2011/0108142 | A1 | * | 5/2011 | Liu | ........................ H01L 23/427 |
| | | | | | 137/561 R |
| 2013/0014924 | A1 | * | 1/2013 | Engelhardt | ................ F28F 9/02 |
| | | | | | 165/175 |
| 2014/0090823 | A1 | * | 4/2014 | Moser | ........................ F28F 9/00 |
| | | | | | 165/169 |
| 2014/0110085 | A1 | * | 4/2014 | Deckers et al. | ....... F24H 9/0015 |
| | | | | | 165/80.1 |
| 2015/0034287 | A1 | * | 2/2015 | Otto | .................... H01M 10/625 |
| | | | | | 165/168 |
| 2016/0056516 | A1 | * | 2/2016 | Srinivasan | .......... H01M 10/613 |
| | | | | | 429/120 |
| 2016/0204486 | A1 | * | 7/2016 | Kenney | ............. H01M 10/6556 |
| | | | | | 429/120 |
| 2016/0282059 | A1 | * | 9/2016 | Schiehlen | ........... B32B 37/1207 |
| 2017/0324128 | A1 | * | 11/2017 | Milton | ................ H01M 10/625 |
| 2017/0324130 | A1 | * | 11/2017 | Benz | ..................... H01M 2/1077 |
| 2018/0337434 | A1 | * | 11/2018 | Burgers | ................ F28F 9/0221 |

FOREIGN PATENT DOCUMENTS

| | | | |
|---|---|---|---|
| JP | 201050000 | | 3/2010 |
| JP | 2013254787 A | * | 12/2013 |
| JP | 2013254787 A2 | | 12/2013 |
| JP | 201638120 | | 3/2016 |
| KR | 10-2014-0007029 | | 1/2014 |
| KR | 20140007029 A | * | 1/2014 |
| WO | 0117055 A1 | | 3/2001 |
| WO | 2012138833 | | 10/2012 |

OTHER PUBLICATIONS

PCT International Preliminary Report on Patentability (Form PCT/IB/373) filed in PCT/JP2016/003578 dated Feb. 6, 2018.
Extended European Search Report (EESR) dated Feb. 25, 2019 issued in the corresponding European patent application No. 16832525.6.
Extended European Search Report (EESR) dated Oct. 17, 2019 issued in the corresponding European patent application No. 19187111.0.

* cited by examiner

COOLER

TECHNICAL FIELD

The present invention relates to a cooler configured to cool heat generated from a battery for a vehicle such as an electric automobile or a hybrid automobile, a power device such as an inverter, or a semiconductor element.

BACKGROUND ART

In general, in a vehicle such as an electric automobile or a hybrid automobile, a battery to be used as a power supply for a motor configured to drive the vehicle.

As the battery, a large-capacity battery is used in order to accelerate the vehicle by driving a motor at the time of start or during traveling of the vehicle and to control a vehicle by braking at the time of sudden stop.

In order to suppress degradation of performance caused by increase in temperature of the battery, it is necessary to forcibly cool the battery through use of a cooler.

As the above-mentioned type of a cooler of the related art, there has been known a cooler having the following structure. That is, a refrigerant passage is formed in a cooling plate (cooler) arranged in a bottom portion of a battery. The cooler is cooled with vaporization heat of a refrigerant supplied to the refrigerant passage, and heat of the battery is transmitted to the cooled cooler, to thereby cool the battery (see, for example, Patent Literature 1).

As one mode of the cooler in Patent Literature 1, an aluminum flat pipe including a plurality of refrigerant passages parallel to each other is used.

When the aluminum flat pipe is used as the cooler, as illustrated in FIG. 13, a height dimension can be reduced through use of a cooling plate a having a flat shape and including a plurality of refrigerant passages c partitioned by a plurality of partition walls b parallel to each other along a longitudinal direction.

Further, in order to distribute the refrigerant in the cooler, it is necessary to connect a refrigerant inlet pipe and a refrigerant outlet pipe to the refrigerant passages c formed in the cooling plate a.

In this case, the following structure is conceivable. As illustrated in FIG. 13 and FIG. 14, a first joining member f1 including a refrigerant inlet connection pipe d and a refrigerant outlet connection pipe e is brought into abutment against and joined to one end of the cooling plate a, and a second joining member f2 having a flow passage (not shown) causing refrigerant passages c on an inlet side and refrigerant passages c on an outlet side to communicate to each other is brought into abutment against and joined to another end of the cooling plate a.

Further, even when the above-mentioned cooling plate is not used in the cooler, it is at least necessary to join the joining member including the refrigerant inlet connection pipe and the refrigerant outlet connection pipe to the cooler.

CITATION LIST

Patent Literature

PTL 1: JP 2010-50000 A (paragraph 0047, and FIG. 1, FIG. 9, and FIG. 10)

SUMMARY OF INVENTION

Technical Problem

However, with regard to the structure in which the joining member including the refrigerant inlet connection pipe and the refrigerant outlet connection pipe is joined to the cooler, for example, there are concerns that the number of components increases and that a space cannot be reduced because the joining member is joined to the cooler.

The present invention has been made in view of the above-mentioned circumstances, and the present invention provides a cooler capable of achieving decrease in the number of components and reduction of the space.

Solution to Problem

In order to achieve the decrease in the number of components and reduction of the space, according to a first aspect of the present invention, there is provided a cooler, including: a cooling plate having a flat shape and including a plurality of refrigerant passages partitioned by a plurality of partition walls parallel to each other along a longitudinal direction; a first cutout portion, which is formed at one end of the cooling plate in the longitudinal direction, and is opened on an upper side and at an end portion in the longitudinal direction while leaving both side walls in a width direction and one of the plurality of partition walls; a second cutout portion, which is formed at another end of the cooling plate in the longitudinal direction, and is opened on the upper side and at an end portion in the longitudinal direction while leaving both the side walls in the width direction; a first upper lid member, which is joined to the first cutout portion, and has a refrigerant inlet port and a refrigerant outlet port respectively communicating to a refrigerant inlet side and a refrigerant outlet side partitioned by the one of the plurality of partition walls; and a second upper lid member, which is joined to the second cutout portion, and forms, between the second upper lid member and the second cutout portion, a flow passage space causing the refrigerant inlet side and the refrigerant outlet side to communicate to each other.

With the above-mentioned configuration, the first upper lid member, which has the refrigerant inlet port and the refrigerant outlet port respectively communicating to the refrigerant inlet side and the refrigerant outlet side partitioned by the partition wall, can be joined to the first cutout portion formed at the one end of the cooling plate having a flat shape and including the plurality of refrigerant passages, and the second upper lid member, which forms the flow passage space causing the refrigerant inlet side and the refrigerant outlet side to communicate to each other, can be joined to the second cutout portion formed at the another end of the cooling plate.

In the present invention, it is preferred that the first upper lid member include a refrigerant inlet side lid half segment having the refrigerant inlet port and a refrigerant outlet side lid half segment having the refrigerant outlet port, the refrigerant inlet side lid half segment and the refrigerant outlet side lid half segment each being joined to a step portion formed at an opening end of an upper part of the cooling plate, side wall step portions formed at upper ends of both the side walls, partition wall step portions formed at upper ends of the partition wall, and end portions of both the side walls on the one end side. It is preferred that the second upper lid member be joined to a step portion formed at an opening end of the upper part of the cooling plate, side wall step portions formed at upper ends of both the side walls, and end portions of both the side walls on the another end side.

With the above-mentioned configuration, the refrigerant inlet side lid half segment having the refrigerant inlet port and the refrigerant outlet side lid half segment having the refrigerant outlet port, which form the first upper lid member, can be joined to the step portion formed at the opening end of the upper part of the cooling plate, the side wall step portions formed at the upper ends of both the side walls, the partition wall step portions formed at the upper ends of the partition wall, and the end portions of both the side walls on the one end side. Further, the second upper lid member can be joined to the step portion formed at the opening end of the upper part of the cooling plate, the side wall step portions formed at the upper ends of both the side walls, and end portions of both the side walls on the another end side.

Further, according to a second aspect of the present invention, there is provided a cooler, including: a cooling plate having a flat shape and including a plurality of refrigerant passages partitioned by a plurality of partition walls parallel to each other along a longitudinal direction; a first cutout portion, which is formed at one end of the cooling plate in the longitudinal direction, and is opened on an upper side and at an end portion in the longitudinal direction while leaving both side walls in a width direction; a second cutout portion, which is formed at another end of the cooling plate in the longitudinal direction, and is opened on the upper side and at an end portion in the longitudinal direction while leaving both the side walls in the width direction; a first upper lid member, which is joined to the first cutout portion, and has a refrigerant inlet port communicating to a refrigerant inlet side space formed by both the side walls; and a second upper lid member, which is joined to the second cutout portion, and has a refrigerant outlet port communicating to a refrigerant outlet side space formed by both the side walls.

With the above-mentioned configuration, the first upper lid member having the refrigerant inlet port and the second upper lid member having the refrigerant outlet port can be joined to the first cutout portion and the second cutout portion formed at both the longitudinal ends of the cooling plate having a flat shape and including the plurality of refrigerant passages. Further, the first upper lid member and the second upper lid member can be formed of a common member.

In the present invention, it is preferred that the first upper lid member and the second upper lid member be each joined to a step portion formed at an opening end of an upper part of the cooling plate, side wall step portions formed at upper ends of both the side walls, and end portions of both the side walls in the longitudinal direction.

With the above-mentioned configuration, the first upper lid member having the refrigerant inlet port and the second upper lid member having the refrigerant outlet port can be each joined to the step portion formed at the opening end of the upper part of the cooling plate, the side wall step portions formed at the upper ends of both the side walls, and the end portions of both the side walls in the longitudinal direction.

In addition, in the present invention, it is preferred that the cooling plate be formed of an aluminum profile, and that the first upper lid member and the second upper lid member be each formed of an aluminum member, the first upper lid member and the second upper lid member each being joined to the cooling plate by brazing. Here the term "aluminum" encompasses an aluminum alloy.

With the above-mentioned configuration, the cooling plate and the first upper lid member (including the refrigerant inlet side lid half segment and the refrigerant outlet side lid half segment) can be integrally brazed to each other, and the cooling plate and the second upper lid member can be integrally brazed to each other.

Advantageous Effects of Invention

According to the present invention, with the above-mentioned configuration, the following effects are obtained.

(1) According to one aspect of the invention, the first upper lid member, which has the refrigerant inlet port and the refrigerant outlet port respectively communicating to the refrigerant inlet side and the refrigerant outlet side, is joined to the first cutout portion formed at the one end of the cooling plate having a flat shape, and the second upper lid member, which forms the flow passage space causing the refrigerant inlet side and the refrigerant outlet side to communicate to each other, is joined to the second cutout portion formed at the another end of the cooling plate. Therefore, the number of components can be decreased, and the space can be reduced.

(2) According to one aspect of the invention, the refrigerant inlet side lid half segment and the refrigerant outlet side lid half segment, which form the first upper lid member, are each joined to the step portion formed at the opening end of the upper part of the cooling plate, the side wall step portions formed at the upper ends of both the side walls, the partition wall step portions formed at the upper ends of the partition wall, and the end portions of both the side walls on the one end side. Further, the second upper lid member is joined to the step portion formed at the opening end of the upper part of the cooling plate, the side wall step portions formed at the upper ends of both the side walls, and end portions of both the side walls on the another end side. Therefore, in addition to the above-mentioned item (1), joining between the cooling plate and the first upper lid member (refrigerant inlet side lid half segment and refrigerant outlet side lid half segment), and joining between the cooling plate and the second upper lid member can be set easier and stronger.

(3) According to one aspect of the invention, the first upper lid member having the refrigerant inlet port and the second upper lid member having the refrigerant outlet port can be joined to the first cutout portion and the second cutout portion formed at both the longitudinal ends of the cooling plate having a flat shape, and the first upper lid member and the second upper lid member can be formed of a common member. Therefore, the number of components can be decreased, and the space can be reduced.

(4) According to one aspect of the invention, the first and second upper lid members are each joined to the step portion formed at the opening end of the upper part of the cooling plate, the side wall step portions formed at the upper ends of both the side walls, and the end portions of both the side walls in the longitudinal direction. Therefore, in addition to the above-mentioned item (3), the joining between the cooling plate and the first upper lid member and the joining between the cooling plate and the second upper lid member can be set easier and stronger.

(5) According to one aspect of the invention, the cooling plate and the first upper lid member (including the refrigerant inlet side lid half segment and the refrigerant outlet side lid half segment) can be integrally brazed to each other, and the cooling plate and the second upper lid member can be integrally brazed to each other. Therefore, in addition to the above-mentioned items (1) to (4), the joining between the cooling plate and the first upper lid member (including the refrigerant inlet side lid half segment and the refrigerant outlet side lid half segment) and the joining between the cooling plate and the second upper lid member can be set easier and stronger.

DESCRIPTION OF EMBODIMENTS

Now, embodiments of the present invention are described in detail with reference to the accompanying drawings.

Figure 1A:
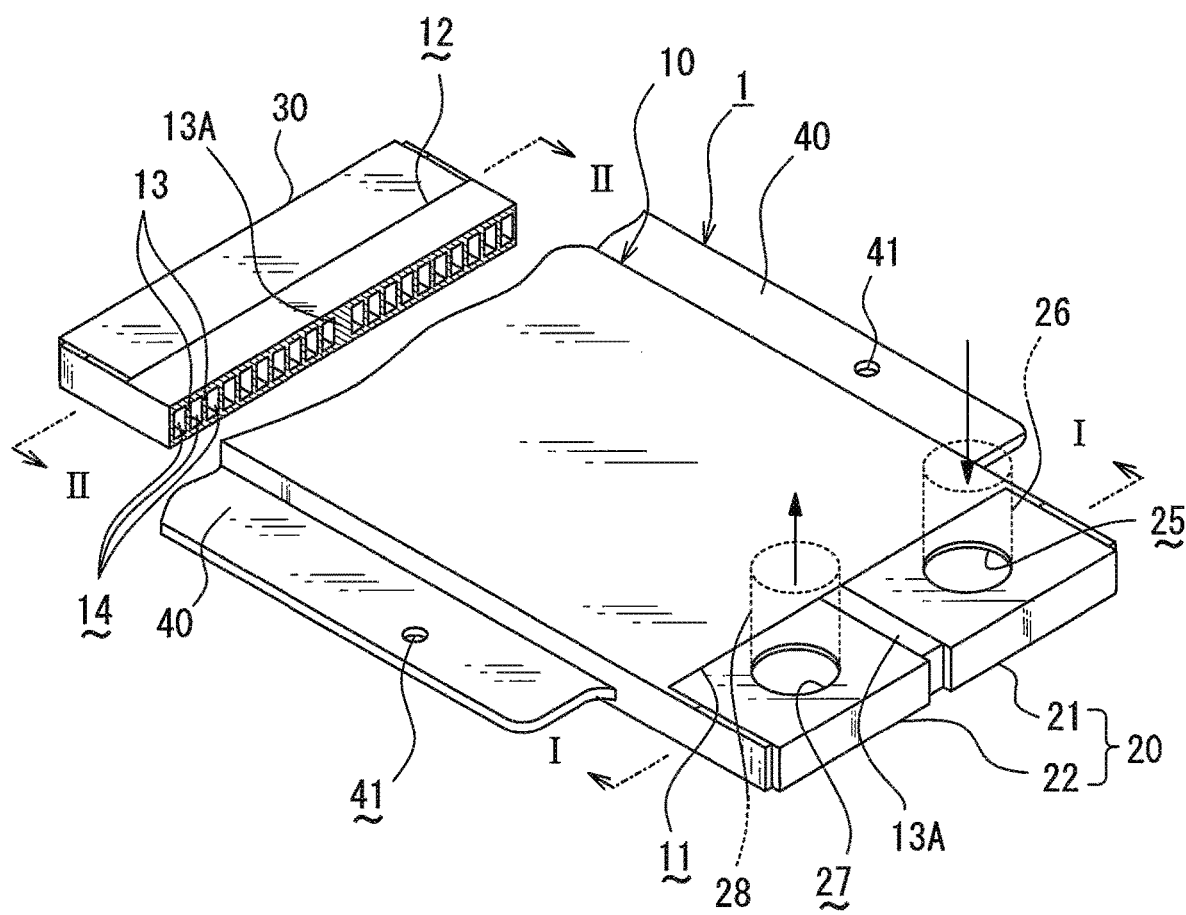
FIG. 1(a) is a perspective view for illustrating a cooler according to a first embodiment of the present invention, with a partial cross section.
Figure 1B:
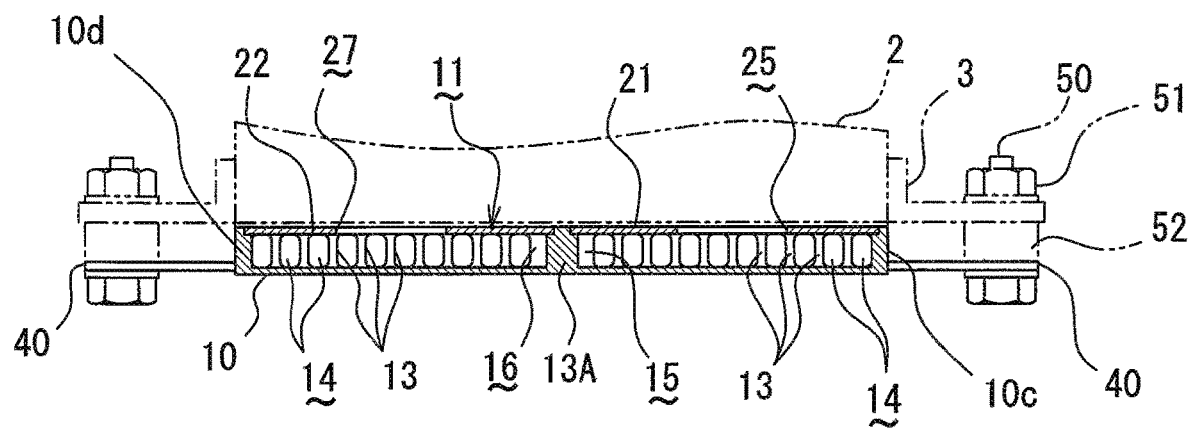
FIG. 1(b) is a sectional view takes along the line I-I of FIG. 1(a).
Figure 1C:
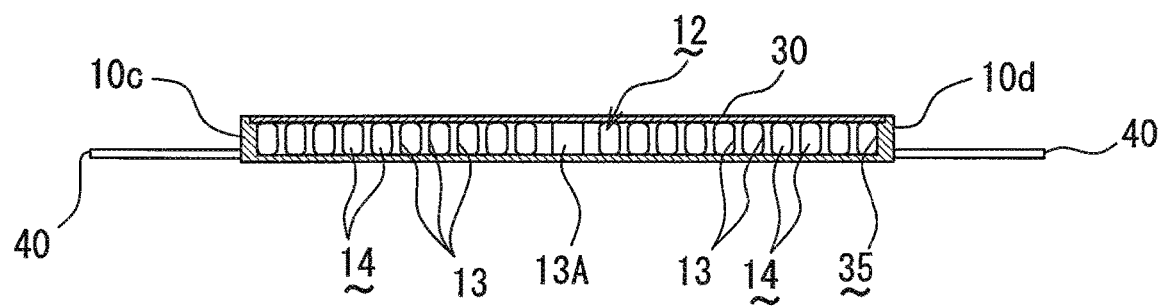
FIG. 1(c) is a sectional view taken along the line II-II of FIG. 1(a).

As illustrated in FIG. 1, a cooler 1 according to the present invention includes a cooling plate 10, a first upper lid member 20, and a second upper lid 30. The cooling plate 10 is arranged in a bottom portion of a battery 2 that is to be used as, for example, a power supply for a motor configured to drive a vehicle. The first upper lid member 20 is joined to a first cutout portion 11 formed at one end of the cooling plate 10 in a longitudinal direction. The second upper lid member 30 is joined to a second cutout portion 12 formed at another end of the cooling plate 10 in the longitudinal direction.

The cooling plate 10 is formed of a flat extruded profile made of aluminum or aluminum alloy (hereinafter referred to as "aluminum") having a substantially rectangular shape in plan view and including a plurality of refrigerant passages 14 partitioned by a plurality of partition walls 13 parallel to each other along the longitudinal direction. In this case, a partition wall 13A at the center is formed so as to be thicker than other partition walls 13, and the refrigerant passages 14 are divided into a refrigerant inlet side and a refrigerant outlet side with respect to the partition wall 13A at the center.

Further, the first cutout portion 11 is formed at one end of the cooling plate 10 in the longitudinal direction. The first cutout portion 11 is opened on an upper side and at an end portion in the longitudinal direction while leaving both side walls 10c and 10d in a width direction and one partition wall, that is, the partition wall 13A at the center.

Figure 2:
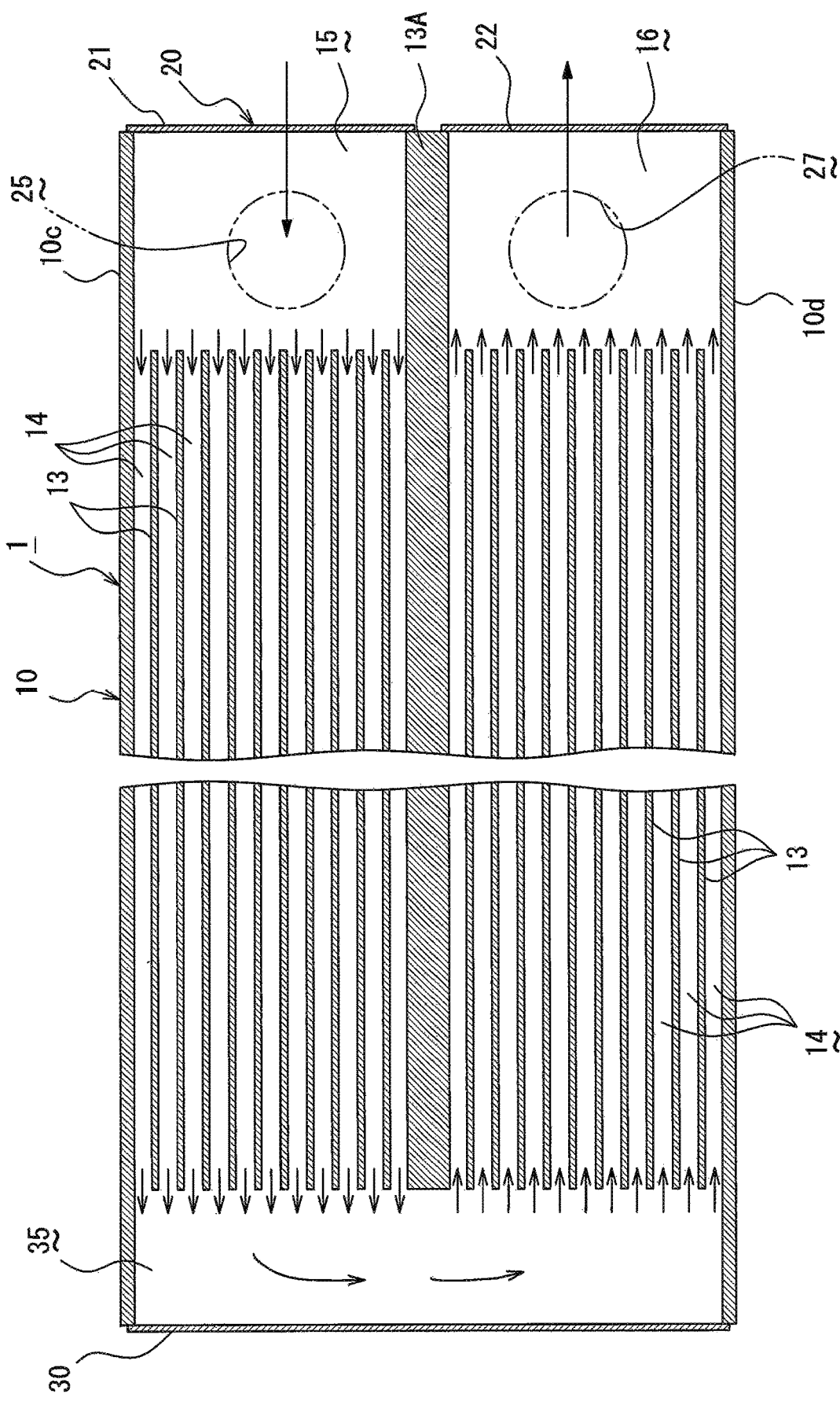
FIG. 2 is a schematic transverse sectional view for illustrating main portions of the cooler according to the first embodiment.

In this case, as illustrated in FIG. 2, the first cutout portion 11 has a refrigerant inlet side space 15 and a refrigerant outlet side space 16. The refrigerant inlet side space 15 is formed by the partition wall 13A at the center and one side wall 10c. The refrigerant outlet side space 16 is formed by the partition wall 13A at the center and another side wall 10d.

The first upper lid member 20 joined to the first cutout portion 11 includes a refrigerant inlet side lid half segment 21 and a refrigerant outlet side lid half segment 22. The refrigerant inlet side lid half segment 21 is joined to the first cutout portion 11 so as to fill the refrigerant inlet side space 15 of the first cutout portion 11. The refrigerant outlet side lid half segment 22 is joined to the first cutout portion 11 so as to fill the refrigerant outlet side space 16 of the first cutout portion 11.

The refrigerant inlet side lid half segment 21 and the refrigerant outlet side lid half segment 22 are each formed of an aluminum plate material including a horizontal part 23 that fills an upper portion of the refrigerant inlet side space 15 or the refrigerant outlet side space 16 and a vertical part 24 that fills an end portion in the longitudinal direction. In this case, the refrigerant inlet side lid half segment 21 and the refrigerant outlet side lid half segment 22 are each formed of a brazing sheet having a brazing filler metal bonded thereto as a surface material.

The horizontal part 23 of the refrigerant inlet side lid half segment 21 has a refrigerant inlet port 25, and a refrigerant inlet connection pipe 26 is joined to the refrigerant inlet port 25. Further, the horizontal part 23 of the refrigerant outlet side lid half segment 22 has a refrigerant outlet port 27, and a refrigerant outlet connection pipe 28 is joined to the refrigerant outlet port 27.

Figure 3:
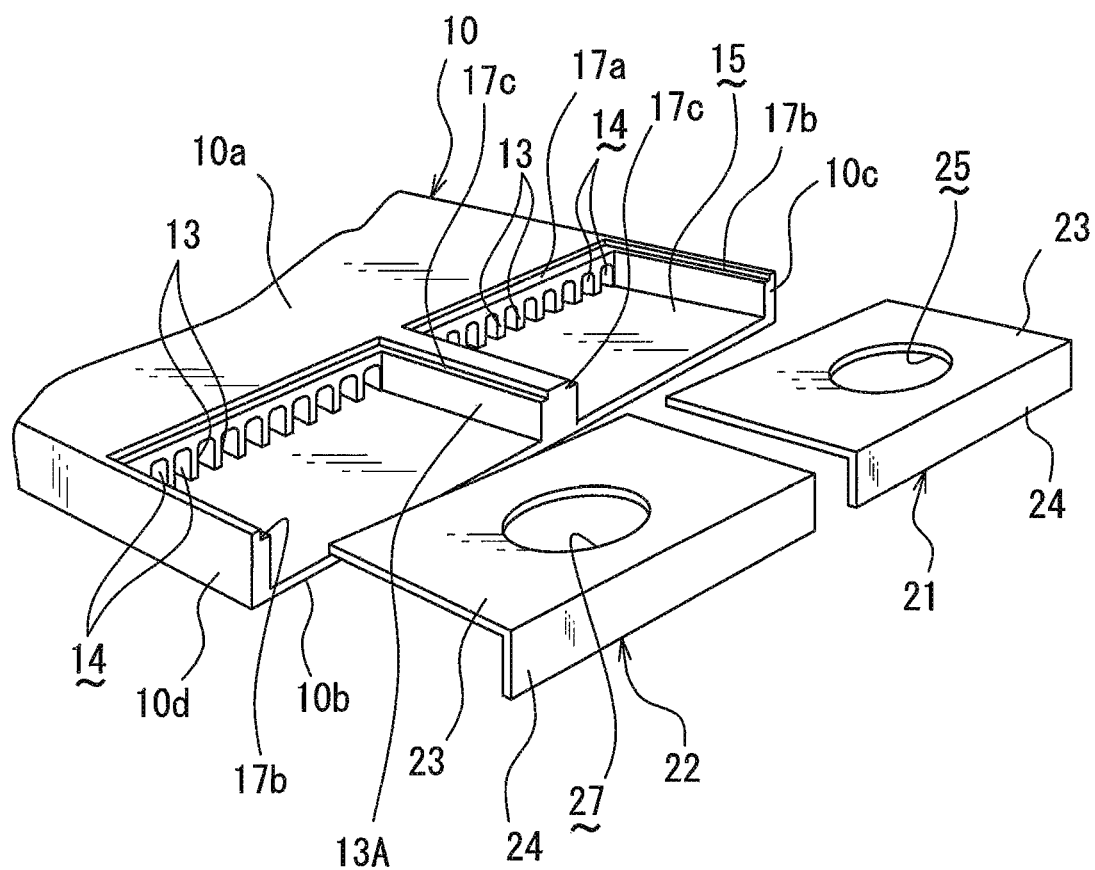
FIG. 3 is an exploded perspective view for illustrating a cooling plate, and a refrigerant inlet side lid half segment and a refrigerant outlet side lid half segment which form a first upper lid member in the first embodiment.

As illustrated in FIG. 3, the refrigerant inlet side lid half segment 21 and the refrigerant outlet side lid half segment 22 described above are each joined by brazing to a step portion 17a formed at an opening end of an upper part 10a of the cooling plate 10, side wall step portions 17b formed at upper ends of both the side walls 10c and 10d, partition wall step portions 17c formed at upper ends of the partition wall 13A at the center, and end portions of both the side walls 10c and 10d on the one end side.

Meanwhile, the second cutout portion 12 is formed at another end of the cooling plate 10 in the longitudinal direction. The second cutout portion 12 is opened on an upper side and at an end portion in the longitudinal direction while leaving both the side walls 10c and 10d in the width direction.

The second upper lid member 30 joined to the second cutout potion 12 is formed of an aluminum plate material including a horizontal part 31 that fills an upper portion of both the side walls 10c and 10d and a vertical part 32 that fills an end portion in the longitudinal direction. In this case, the second upper lid member 30 is formed of a brazing sheet having a brazing filler metal bonded thereto as a surface material.

Figure 4:
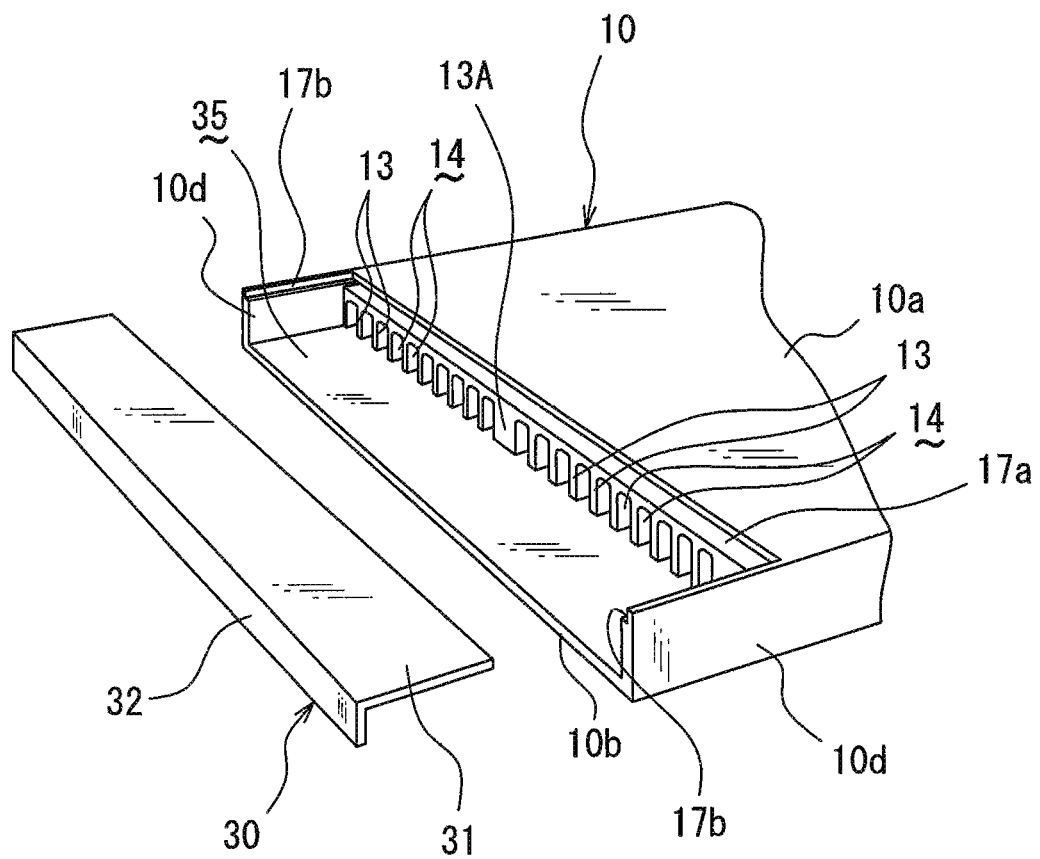
FIG. 4 is an exploded perspective view for illustrating the cooling plate and a second upper lid member in the first embodiment.
Figure 5A:
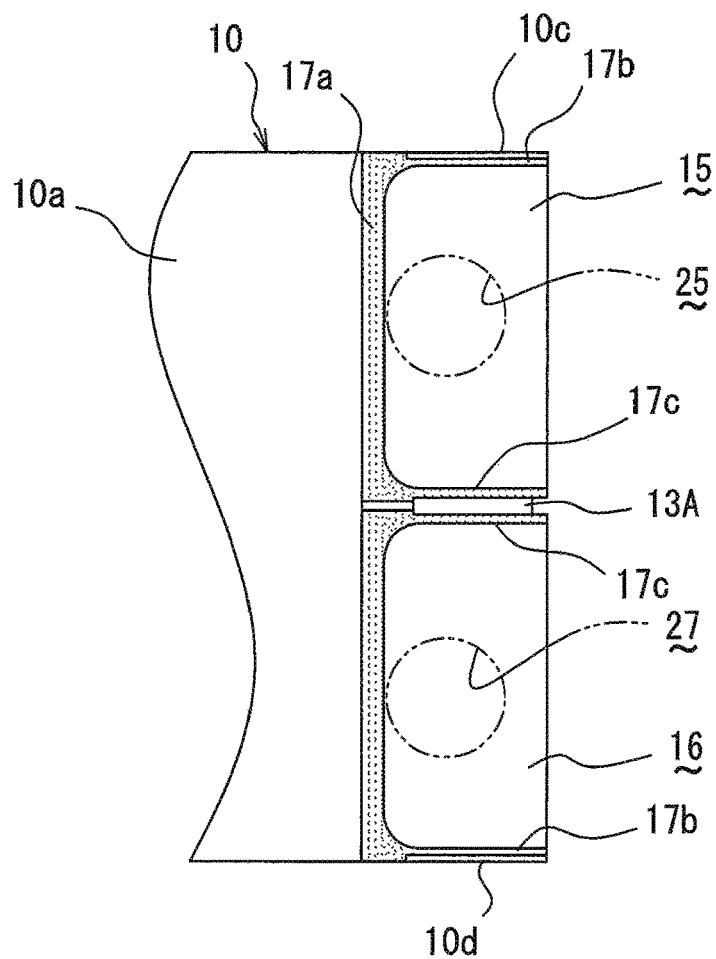
FIG. 5(a) is a plan view for illustrating a joint portion between the cooling plate and the first upper lid member in the first embodiment.
Figure 5B:
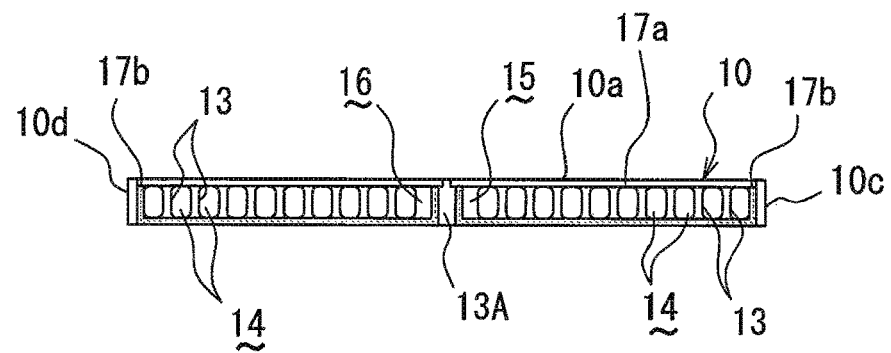
FIG. 5(b) is a side view for illustrating the joint portion between the cooling plate and the first upper lid member in the first embodiment.
Figure 6A:
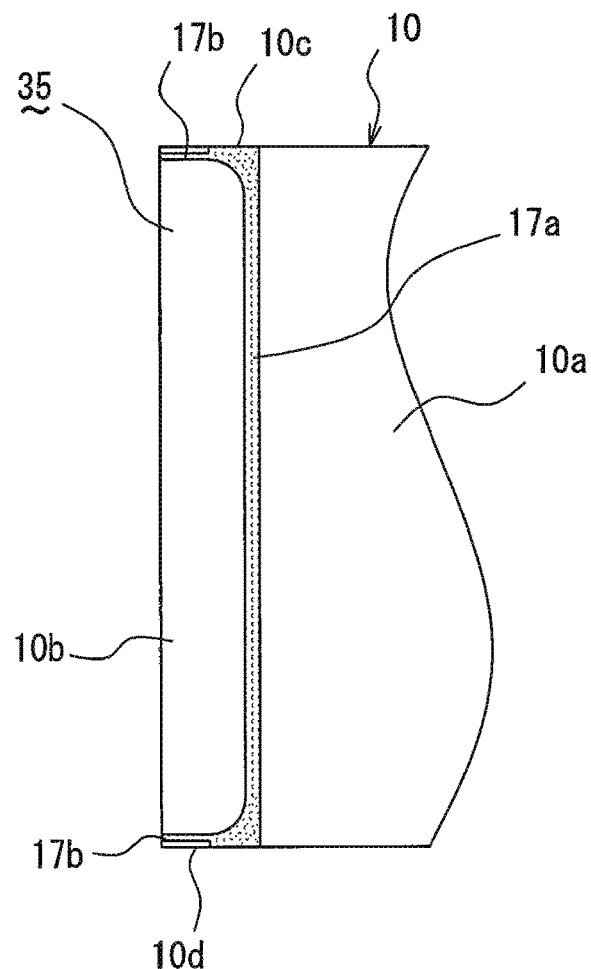
FIG. 6(a) is a plan view for illustrating a joint portion between the cooling plate and the second upper lid member in the first embodiment.
Figure 6B:
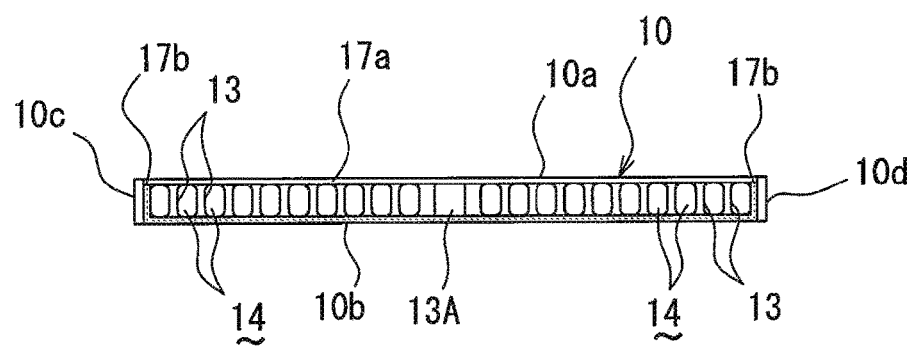
FIG. 6(b) is a side view for illustrating the joint portion between the cooling plate and the second upper lid member in the first embodiment.

As illustrated in FIG. 4, the second upper lid member 30 is joined by brazing to a step portion 17a formed at an opening end of the upper part 10a of the cooling plate 10, side wall step portions 17b formed at upper ends of both the side walls 10c and 10d, and end portions of both the side walls 10c and 10d on the another end side. When the second upper lid member 30 is joined to the second cutout portion 12, a flow passage space 35 causing the refrigerant inlet side and the refrigerant outlet side to communicate to each other is formed between the second upper lid member 30 and the cooling plate 10.

Flange portions 40 extend along the longitudinal direction at both ends of the cooling plate 10 in the width direction, and a mounting hole 41 in which a fixing screw 50 can be inserted is formed at an appropriate position of each of the flange portions 40. The fixing screw 50 to be inserted in the mounting hole 41 is inserted in a mounting hole (not shown) formed in a bracket 3 supporting the battery 2 through intermediation of a spacer 52, and a nut 51 is threadedly engaged with the fixing screw 50. Thus, it is possible to arrange the cooler 1 in the bottom portion of the battery 2.

In the above-mentioned embodiment, description is given of the case in which the first upper lid member 20 (refrigerant inlet side lid half segment 21 and refrigerant outlet side lid half segment 22) and the second upper lid member 30 are each formed of a brazing sheet having a brazing filler metal bonded thereto as a surface material. However, it is not always required to have such configuration. Instead of forming the first upper lid member 20 (refrigerant inlet side lid half segment 21 and refrigerant outlet side lid half segment 22) and the second upper lid member 30 through use of a brazing sheet, for example, it may be possible to apply a brazing filler metal to a surface of the cooling plate 10 and join the cooling plate 10 by brazing to the first upper lid member 20 (refrigerant inlet side lid half segment 21 and refrigerant outlet side lid half segment 22) and the second upper lid member 30.

Further, as another brazing method, it may also be possible to use high-frequency brazing using a fluoride-based flux containing a powder brazing filler metal, specifically, a powdery aluminum alloy brazing filler metal, which contains 27 mass % to 37 mass % of Cu, 5 mass % to 10 mass % of Si, and the balance of Al and inevitable impurities, and 11 mass % or more of CsF as a solid content.

With the cooler according to the first embodiment having the above-mentioned configuration, the first upper lid member 20, which has the refrigerant inlet port 25 and the refrigerant outlet port 27 respectively communicating to the refrigerant inlet side and the refrigerant outlet side, is joined to the first cutout portion 11 formed at one end of the cooling plate 10 having a flat shape, and the second upper lid member 30, which forms the flow passage space 35 causing the refrigerant inlet side and the refrigerant outlet side to communicate to each other, is joined by brazing to the second cutout portion 12 formed at another end of the cooling plate 10. Therefore, as compared to the case in which the refrigerant inlet connection pipe and the refrigerant outlet connection pipe are joined through use of a joint member, the number of components can be decreased, and the space can be reduced.

Further, the refrigerant inlet side lid half segment 21 and the refrigerant outlet side lid half segment 22, which form the first upper lid member 20, are each joined to the step portion 17a formed at the opening end of the upper part of the cooling plate 10, the side wall step portions 17b formed at the upper ends of both the side walls 10c and 10d, the partition wall step portions 17c formed at the upper ends of the partition wall 13A, and the end portions of both the side walls 10c and 10d on the one end side, and the second upper lid member 30 is joined to the step portion 17a formed at the opening end of the upper part 10a of the cooling plate 10, the side wall step portions 17b formed at the upper ends of both the side walls 10c and 10d, and end portions of both the side walls on the another end side. Therefore, joining between the cooling plate 10 and the first upper lid member 20 (refrigerant inlet side lid half segment 21 and refrigerant outlet side lid half segment 22), and joining between the cooling plate 10 and the second upper lid member 30 can be set easier and stronger.

In the first embodiment, the cooler of two-path (U-turn) type refrigerant flow is described. However, the present invention is also applicable to a cooler of one-path (zero-turn) type refrigerant flow according to a second embodiment of the present invention described below.

Figure 7A:
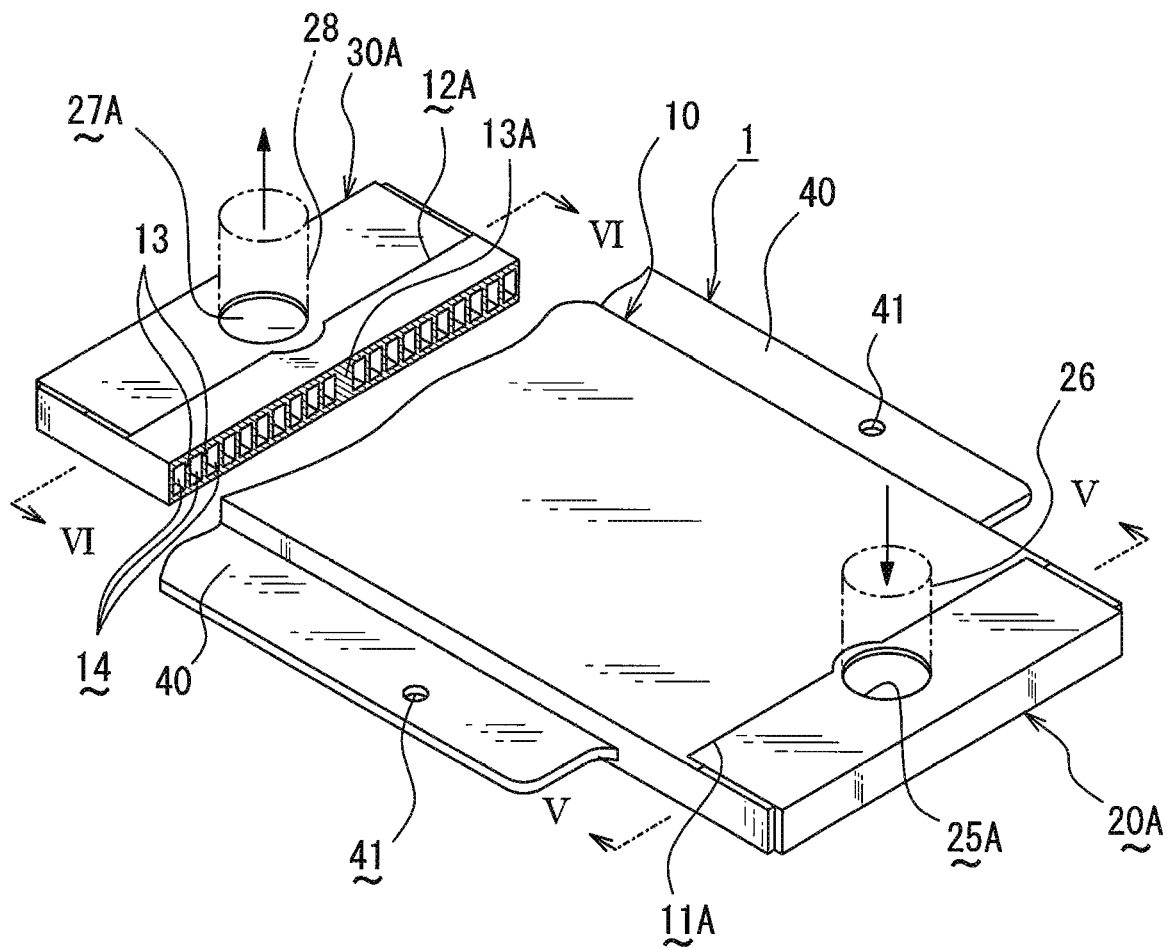
FIG. 7(a) is a perspective view for illustrating a cooler according to a second embodiment of the present invention, with a partial cross section.
Figure 7B:
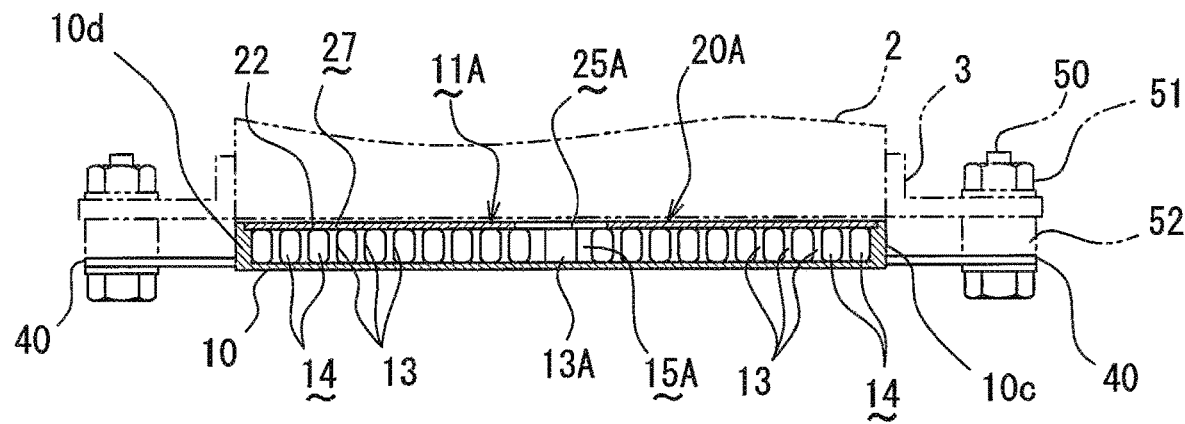
FIG. 7(b) is a sectional view taken along the line V-V of FIG. 7(a).
Figure 7C:
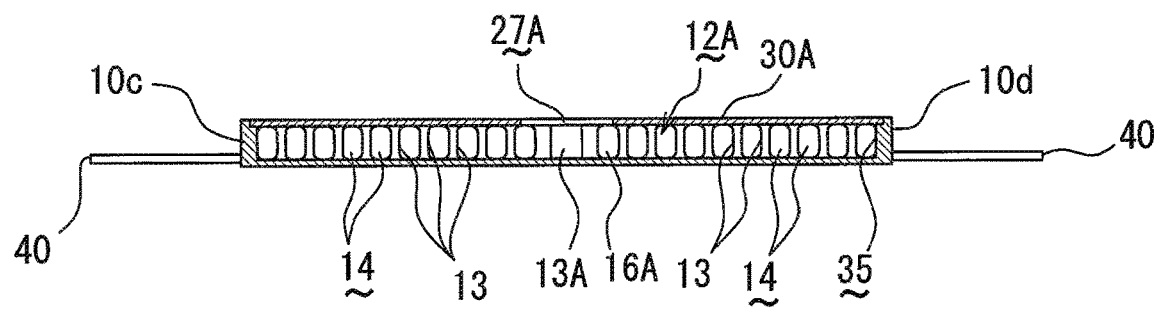
FIG. 7(c) is a sectional view taken along the line VI-VI of FIG. 7(a).
Figure 8:
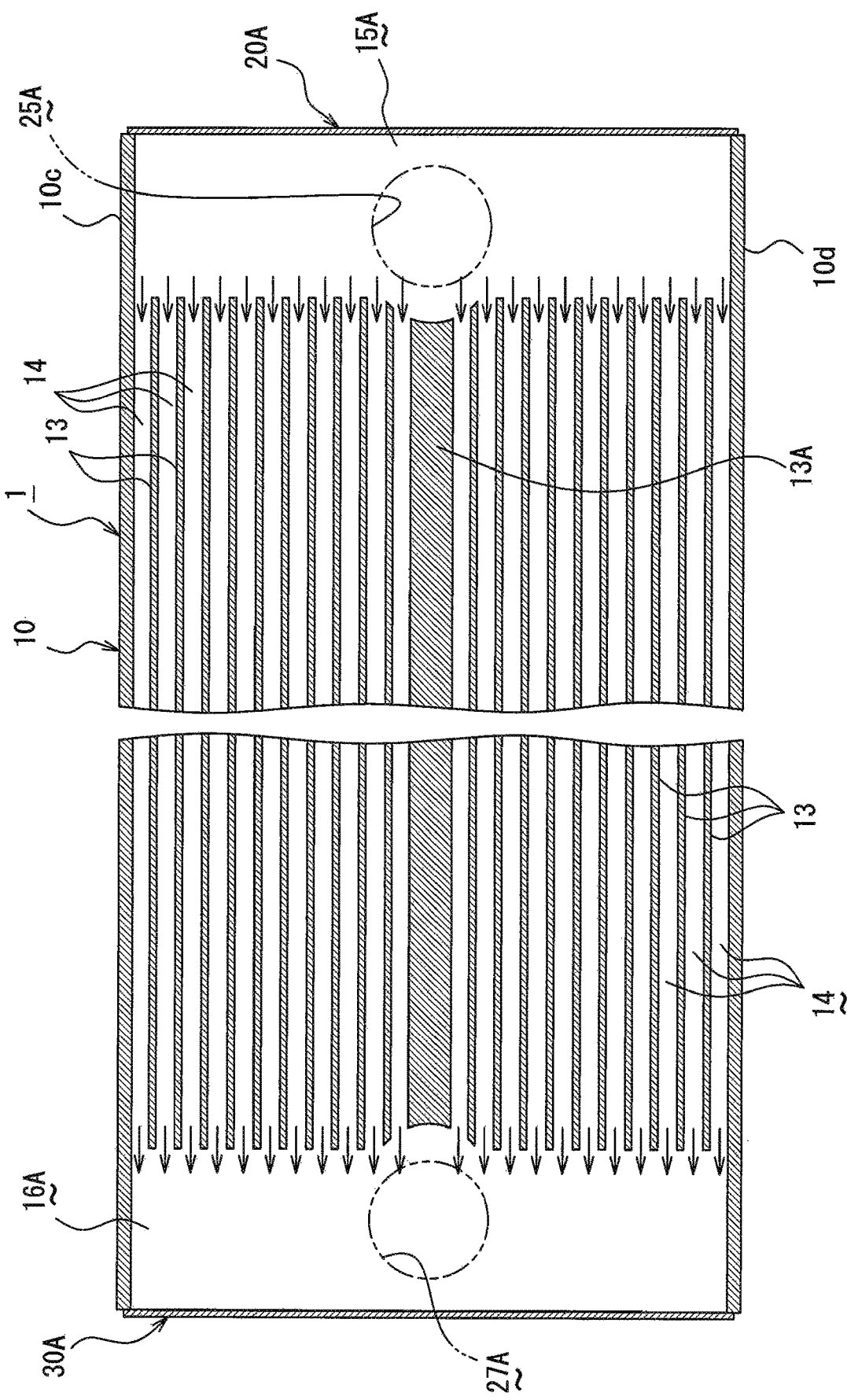
FIG. 8 is a schematic transverse sectional view for illustrating main portions of the cooler according to the second embodiment.

As illustrated in FIG. 7 and FIG. 8, the cooler 1 according to the second embodiment includes a first cutout portion 11A, a second cut out portion 12A, a first upper lid member 20A, and a second upper lid member 30A. The first cutout portion 11A is formed at one end of the cooling plate 10 in the longitudinal direction and is opened on an upper side and at an end portion in the longitudinal direction while leaving both the side walls 10c and 10d in a width direction. The second cutout portion 12A is formed at another end of the cooling plate 10 in the longitudinal direction and is opened on an upper side and at an end portion in the longitudinal direction while leaving both the side walls 10c and 10d in the width direction. The first upper lid member 20A is joined to the first cutout portion 11A and has a refrigerant inlet port 25A communicating to a refrigerant inlet side space 15A formed by both the side walls 10c and 10d. The second upper lid member 30A is joined to the second cutout portion 12A and has a refrigerant outlet port 27A communicating to a refrigerant outlet side space 16A formed by both the side walls 10c and 10d.

The first upper lid member 20A is formed of an aluminum plate material including the horizontal part 23 that fills an upper portion of the refrigerant inlet side space 15A and a vertical part 24 that fills the end portion in the longitudinal direction. A projecting piece 23a having a protruding arc shape, which extends outward, is formed in a center portion on a distal end side of the horizontal part 23 of the first upper lid member 20A. Further, the refrigerant inlet port 25A is formed in the horizontal part 23, and the refrigerant inlet connection pipe 26 is joined to the refrigerant inlet port 25A.

Figure 9:
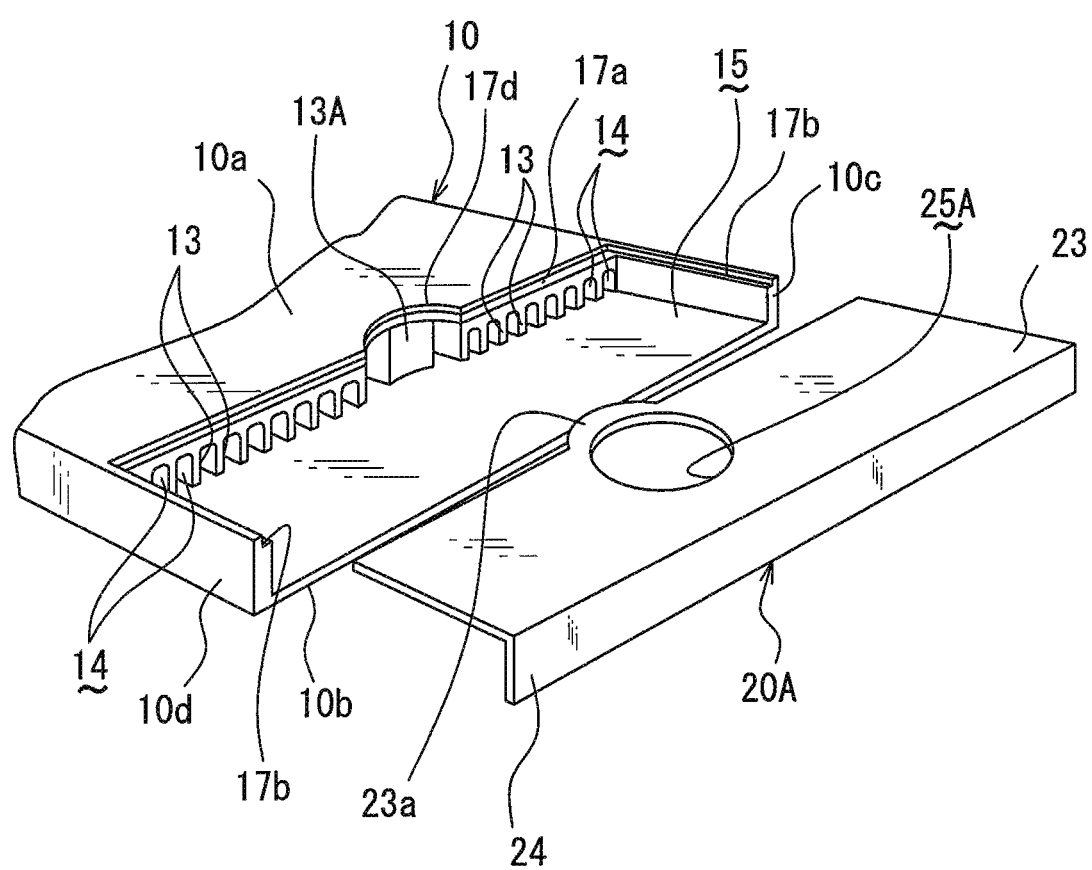
FIG. 9 is an exploded perspective view for illustrating a cooling plate and a first upper lid member in the second embodiment.

As illustrated in FIG. 9, the first upper lid member 20A is joined by brazing to the step portion 17a and an arc-shaped partition wall step portion 17d formed at an opening end of the upper part 10a of the cooling plate 10, the side wall step portions 17b formed at upper ends of both the side walls 10c and 10d, and one end side end potions of both the side walls 10c and 10d. In this case, joining by brazing is performed under a state in which the projecting piece 23a having a protruding arc shape is engaged with the arc-shaped partition wall step portion 17d.

As described above, when brazing is performed under a state in which the projecting piece 23a having a protruding arc shape is engaged with the arc-shaped partition wall step portion 17d, the first upper lid member 20A is positioned with respect to the first cutout portion 11A to perform brazing easily and securely.

Meanwhile, the second upper lid member 30A joined to the second cutout portion 12A is formed of an aluminum plate material including the horizontal part 31 that fills an upper portion of both the side walls 10c and 10d and the vertical part 32 that fills the end portion in the longitudinal direction. A projecting piece 31a having a protruding arc shape, which extends outward, is formed in a center portion on a distal end side of the horizontal part 31 of the second upper lid member 30A. Further, a refrigerant outlet port 27A is formed in the horizontal part 31, and the refrigerant outlet connection pipe 28 is joined to the refrigerant outlet port 27A.

Figure 10:
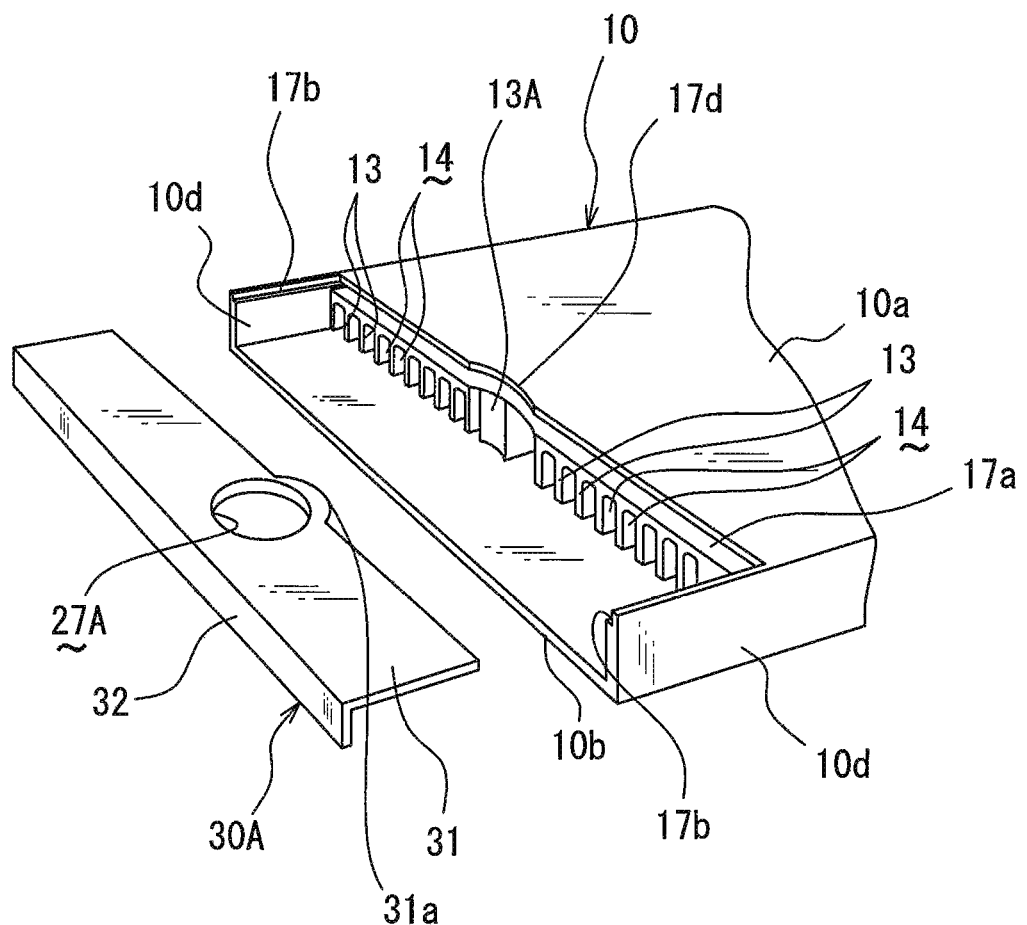
FIG. 10 is an exploded perspective view for illustrating the cooling plate and a second upper lid member in the second embodiment.
Figure 11:
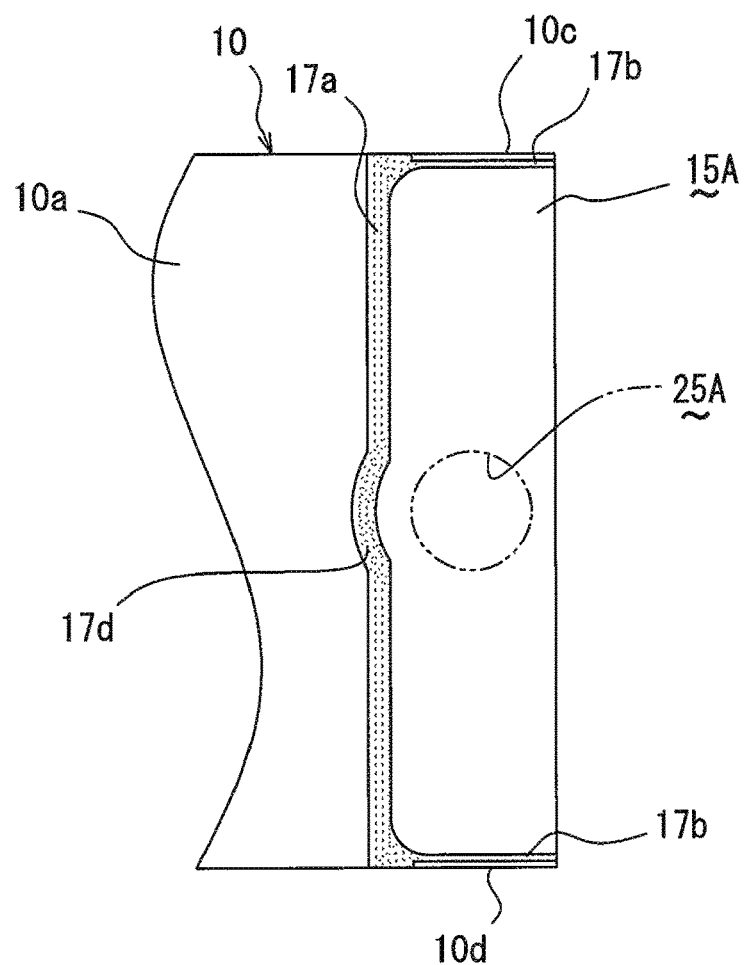
FIG. 11(a) is a plan view for illustrating a joint portion between the cooling plate and the first upper lid member in the second embodiment.
FIG. 11(b) is a side view for illustrating the joint portion between the cooling plate and the first upper lid member in the second embodiment.
Figure 11:
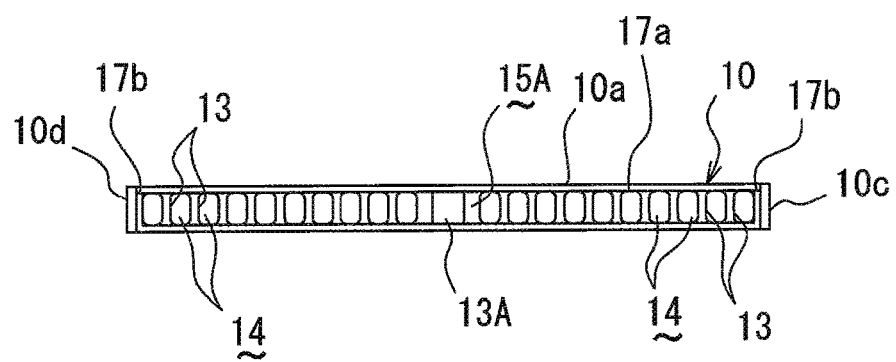
Figure 12A:
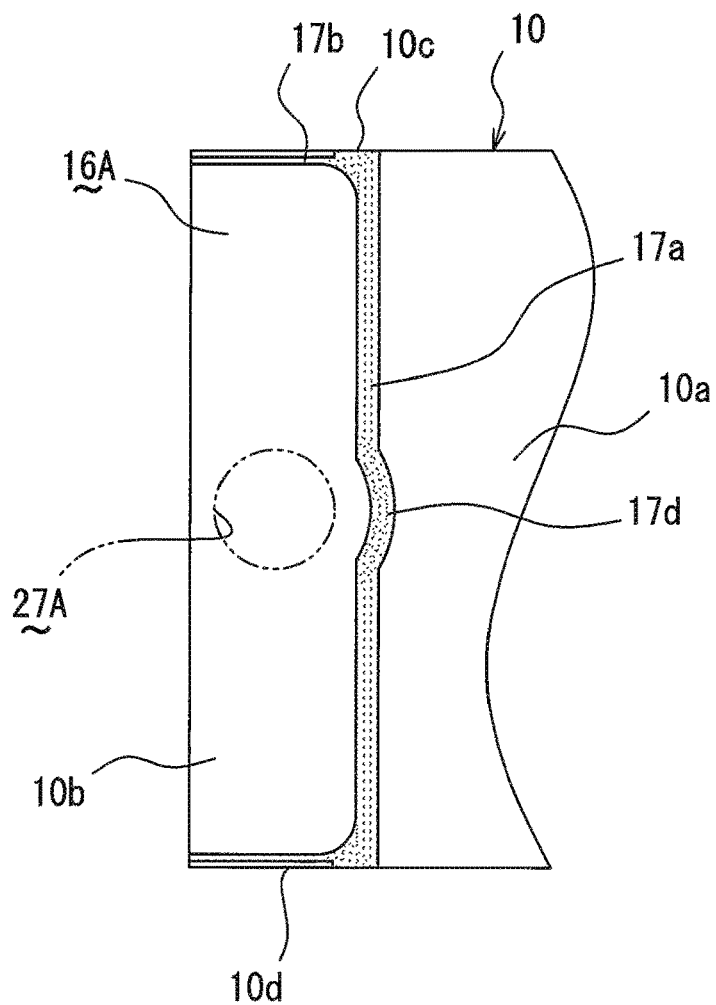
FIG. 12(a) is a plan view for illustrating a joint portion between the cooling plate and the second upper lid member in the second embodiment.
Figure 12B:
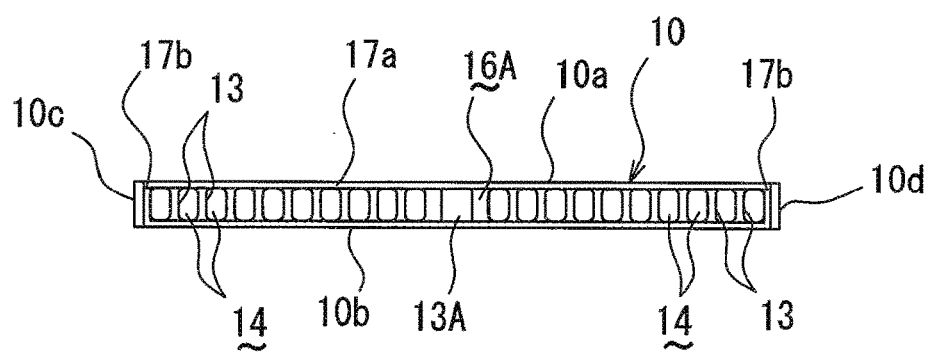
FIG. 12(b) is a side view for illustrating the joint portion between the cooling plate and the second upper lid member in the second embodiment.
Figure 13A:
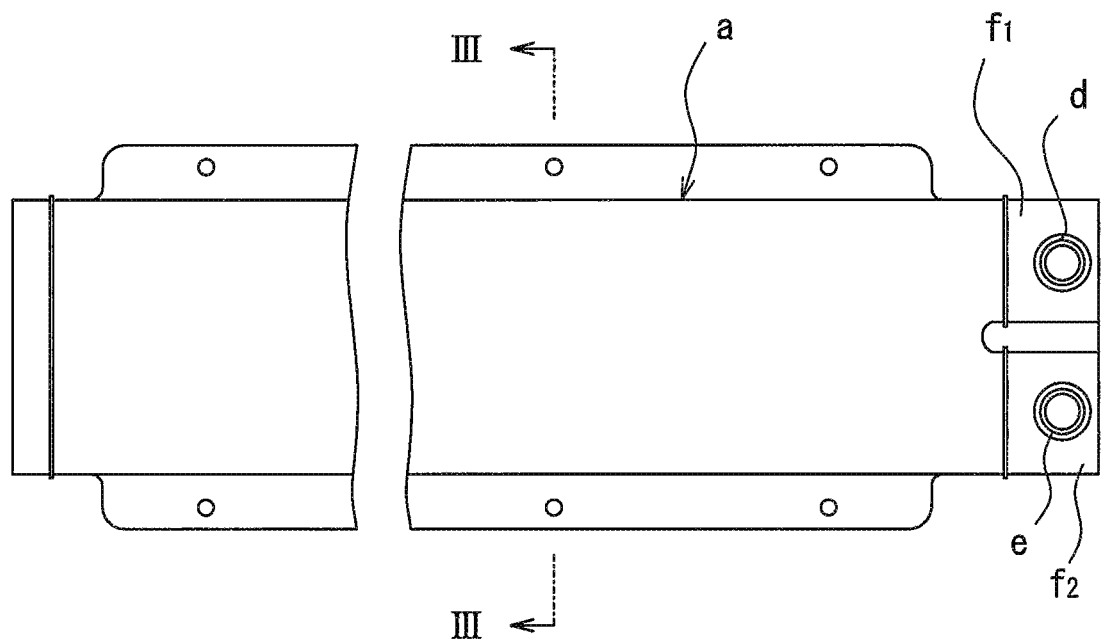
FIG. 13(a) is a schematic plan view for illustrating a related-art cooler.
Figure 13B:
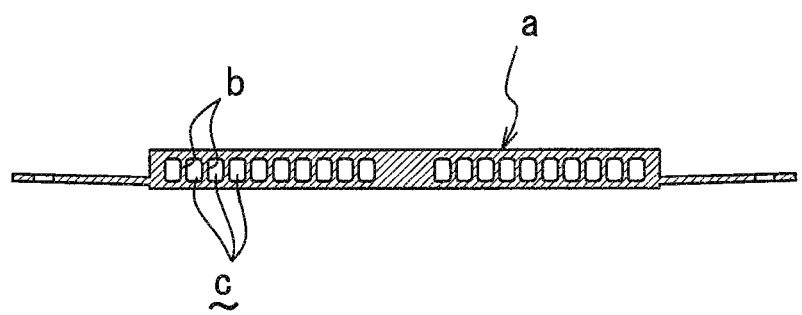
FIG. 13(b) is a sectional view taken along the line III-III of FIG. 13(a).
Figure 14A:
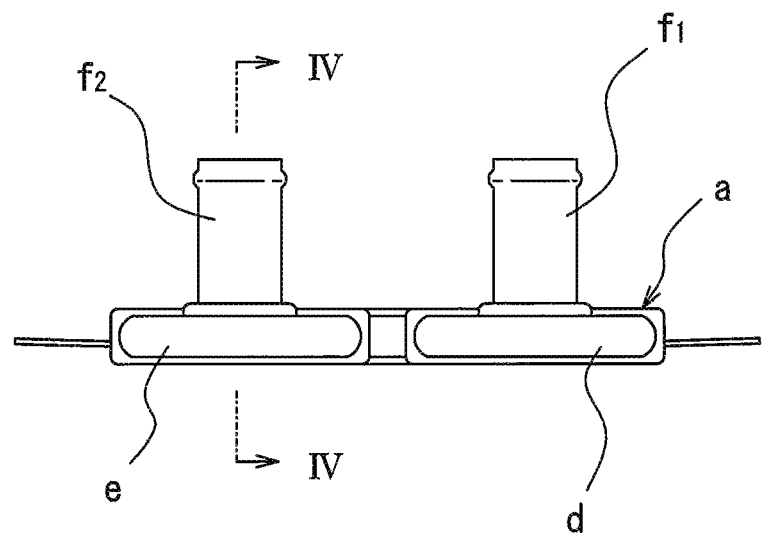
FIG. 14(a) is a side view for illustrating the related-art cooler.
Figure 14B:
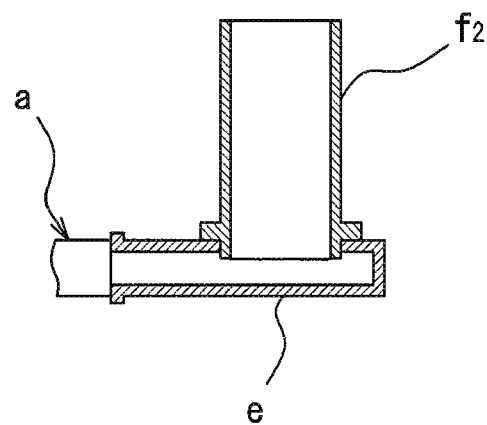
FIG. 14(b) is a sectional view taken along the line IV-IV of FIG. 14(a).

As illustrated in FIG. 10, the second upper lid member 30A is joined by brazing to the step portion 17a and the arc-shaped partition wall step portion 17d formed at an opening end of the upper part 10a of the cooling plate 10, the side wall step portions 17b formed at upper ends of both the side walls 10c and 10d, and another end side end potions of both the side walls 10c and 10d. In this case, joining by brazing is performed under a state in which the projecting piece 31a having a protruding arc shape is engaged with the arc-shaped partition wall step portion 17d. Thus, in the same manner as in the case of the first cutout portion 11A and the first upper lid member 20A, brazing of the second upper lid member 30A with respect to the second cutout portion 12A can be performed easily and securely.

The first upper lid member 20A and the second upper lid member 30A formed as described above are formed of an aluminum plate material having the same shape.

In the second embodiment, other portions are the same as those of the first embodiment. Therefore, the same portions are denoted by the same reference symbols, and description thereof is omitted.

With the cooler according to the second embodiment having the above-mentioned configuration, the first upper lid member 20A having the refrigerant inlet port 25A and the second upper lid member 30A having the refrigerant outlet port 27A are joined to the first cutout portion 11A and the second cutout portion 12A formed at both the ends of the cooling plate 10 having a flat shape in the longitudinal direction, and the first upper lid member 20A and the second upper lid member 30A are formed of the common aluminum plate material. Therefore, the number of components can be decreased, and the space can be reduced.

When the first upper lid member 20A and the second upper lid member 30A are joined to the step portion 17a and the arc-shaped partition wall step portion 17d formed at the opening end of the upper part 10a of the cooling plate 10, the side wall step portions 17b formed at upper ends of both the side walls 10c and 10d, and the longitudinal ends of both the side walls 10c and 10d, joining between the cooling plate 10 and the first upper lid member 20A and joining between the cooling plate 10 and the second upper lid member 30A can further be set easier and stronger.

In the above-mentioned embodiments, description is given of the case in which the cooler according to the present invention is used for cooling heat generated from the battery 2 to be used as a power supply for a motor configured to drive a vehicle. However, the cooler according to the present invention is not limited thereto, and the present invention is also applicable to a cooler configured to cool heat generated from a power device such as an inverter or a semiconductor element.

REFERENCE SIGNS LIST 10 cooling plate
10a upper part
10b lower part
10c, 10d side wall
13, 13A partition wall
14 refrigerant passage
15, 15A refrigerant inlet side space
16, 16A refrigerant outlet side space
17a step portion
17b side wall step portion
17c partition wall step portion
17d arc-shaped partition wall step portion
20, 20A first upper lid member
21 refrigerant inlet side lid half segment
22 refrigerant outlet side lid half segment
25, 25A refrigerant inlet port
27, 27A refrigerant outlet port
30, 30A second upper lid member
35 flow passage space

The invention claimed is:
1. A cooler, comprising:
a cooling plate having a flat shape and including a plurality of refrigerant passages partitioned by a plurality of partition walls parallel to each other along a longitudinal direction;
a first cutout portion, which is formed at one end of the cooling plate in the longitudinal direction, and is opened on an upper side and at an end portion in the longitudinal direction while leaving both side walls in a width direction and one of the plurality of partition walls;
a second cutout portion, which is formed at another end of the cooling plate in the longitudinal direction, and is opened on the upper side and at an end portion in the longitudinal direction while leaving both the side walls in the width direction;
a first upper lid member, which is joined to the first cutout portion, and has a refrigerant inlet port and a refrigerant outlet port respectively communicating to a refrigerant inlet side and a refrigerant outlet side partitioned by the one of the plurality of partition walls; and
a second upper lid member, which is joined to the second cutout portion, and forms, between the second upper lid member and the second cutout portion, a flow passage space causing the refrigerant inlet side and the refrigerant outlet side to communicate to each other, wherein the first upper lid member includes a refrigerant inlet side lid half segment having the refrigerant inlet port and a refrigerant outlet side lid half segment having the refrigerant outlet port, the refrigerant inlet side lid half segment and the refrigerant outlet side lid half segment each being joined to a step portion formed at an opening end of an upper part of the cooling plate, side wall step portions formed at upper ends of both the side walls, partition wall step portions formed at upper ends of the partition wall, and end portions of both the side walls on the one end side, and wherein the second upper lid member is joined to a step portion formed at an opening end of the upper part of the cooling plate, side wall step portions formed at upper ends of both the side walls, and end portions of both the side walls on the another end side.

2. A cooler according to claim 1, wherein the cooling plate is formed of an aluminum profile, and the first upper lid member and the second upper lid member are each formed of an aluminum member, the first upper lid member and the second upper lid member each being joined to the cooling plate by brazing.

3. A cooler, comprising:
- a cooling plate having a flat shape and including a plurality of refrigerant passages partitioned by a plurality of partition walls parallel to each other along a longitudinal direction;
- a first cutout portion, which is formed at one end of the cooling plate in the longitudinal direction, and is opened on an upper side and at an end portion in the longitudinal direction while leaving both side walls in a width direction;
- a second cutout portion, which is formed at another end of the cooling plate in the longitudinal direction, and is opened on the upper side and at an end portion in the longitudinal direction while leaving both the side walls in the width direction;
- a first upper lid member, which is joined to the first cutout portion, and has a refrigerant inlet port communicating to a refrigerant inlet side space formed by both the side walls; and
- a second upper lid member, which is joined to the second cutout portion, and has a refrigerant outlet port communicating to a refrigerant outlet side space formed by both the side walls, wherein the first upper lid member and the second upper lid member are each joined to a step portion formed at an opening end of an upper part of the cooling plate, side wall step portions formed at upper ends of both the side walls, and end portions of both the side walls in the longitudinal direction.

4. A cooler according to claim 3, wherein the cooling plate is formed of an aluminum profile, and the first upper lid member and the second upper lid member are each formed of an aluminum member, the first upper lid member and the second upper lid member each being joined to the cooling plate by brazing.

* * * * *